US011336304B2

(12) United States Patent
Sridhara et al.

(10) Patent No.: US 11,336,304 B2
(45) Date of Patent: *May 17, 2022

(54) CONCURRENT RECURSIVE-READ AVERAGING AND ITERATIVE INNER AND OUTER CODE DECODING

(71) Applicant: Seagate Technology LLC, Fremont, CA (US)

(72) Inventors: Deepak Sridhara, Longmont, CO (US); Jason Bellorado, San Jose, CA (US); Ara Patapoutian, Hopkinton, MA (US); Marcus Marrow, San Jose, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 16/908,593

(22) Filed: Jun. 22, 2020

(65) Prior Publication Data

US 2021/0399746 A1 Dec. 23, 2021

(51) Int. Cl.
| G06F 11/10 | (2006.01) |
| G06F 13/28 | (2006.01) |
| G06F 11/30 | (2006.01) |
| G06F 11/16 | (2006.01) |
| H03M 13/29 | (2006.01) |

(52) U.S. Cl.
CPC ............ *H03M 13/2906* (2013.01)

(58) Field of Classification Search
CPC .................................. H03M 13/2906
See application file for complete search history.

(56) References Cited

U.S. PATENT DOCUMENTS

| 9,015,549 | B2 | 4/2015 | Rub et al. |
| 9,928,854 | B1 | 3/2018 | Jury et al. |
| 10,140,180 | B1* | 11/2018 | Sridhara ............... H03M 13/29 |
| 10,177,791 | B1* | 1/2019 | Sridhara ........... H03M 13/2909 |
| 10,382,065 | B1* | 8/2019 | Sridhara ........... H03M 13/2927 |
| 10,719,392 | B1* | 7/2020 | Sridhara ............. G06F 11/1482 |
| 11,042,439 | B1* | 6/2021 | Sridhara ............. G06F 11/1012 |
| 11,121,729 | B1* | 9/2021 | Sridhara ............ H03M 13/1111 |

* cited by examiner

*Primary Examiner* — Guy J Lamarre
(74) *Attorney, Agent, or Firm* — Holzer Patel Drennan

(57) ABSTRACT

In one implementation, the disclosure provides a decoding system that concurrently executes a read sample combining recovery process and an iterative outer code (IOC) recovery process. Performing the read sample combining recovery process entails executing multiple rounds of logic that each provide for combining together different data samples read from a data block. The IOC recovery process is performed at least partially concurrent with the read sample combining recovery process and each round of the IOC recovery process is based on newly-updated data samples generated by the read sample combining recovery process.

20 Claims, 4 Drawing Sheets

CONCURRENT RECURSIVE-READ AVERAGING AND ITERATIVE INNER AND OUTER CODE DECODING

BACKGROUND

In modern disk drives, multi-level blocks codes are typically employed to provide error correction capability for fixed-sized blocks or symbols of predetermined size. For example, an inner code may generate redundant bits (parity bits) usable to correct errors in data blocks of a first fixed size (e.g., a sector), while an outer code may also be applied to a larger fixed sized block, such as a data track, to provide additional protection against failures of the inner code. For example, a track-level outer code may generate additional redundant bits within a data track that are based on inner code (sector-level) encoded bits (e.g., inner code data bits and inner code redundant bits) and usable to correct the encoded bits in the inner code. During a read of a drive with dual-level block code protection, the inner code is typically used as a first resort to recover failed data sectors. If the inner code decoder fails to recover some number of sectors, data of the failed data sectors may then be passed to an outer code decoder that makes a secondary recovery attempt using the outer code.

Although there exist a number of powerful recovery algorithms that utilize either or both inner codes and outer codes, the use of these algorithms is traditionally sequential. Thus, command completion time (CCT) may be greater when multiple recovery algorithms are needed to recovery data than when such data cannot be recovered by a single block-level recovery algorithm.

CCT is key metric pushing areal density in data storage devices today. For cloud storage customers with stringent CCT requirements, it is critical that read/write failures be responded to by invoking powerful recovery algorithms early in the retry sequence to minimize the time to successful recovery.

SUMMARY

In one implementation, an error recovery system includes first and second circuit blocks that perform concurrent recovery operations. The first circuit block performs multiple rounds of a read sample combining recovery process to combine data samples obtained during multiple reads of one or more data blocks on a storage media while the second circuit block concurrently performs multiple rounds of an iterative outer code (IOC) recovery process. Each round of the IOC recovery process is based on newly-updated data samples generated by the first circuit block during the read sample combining recovery process.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTION

Figure 1:
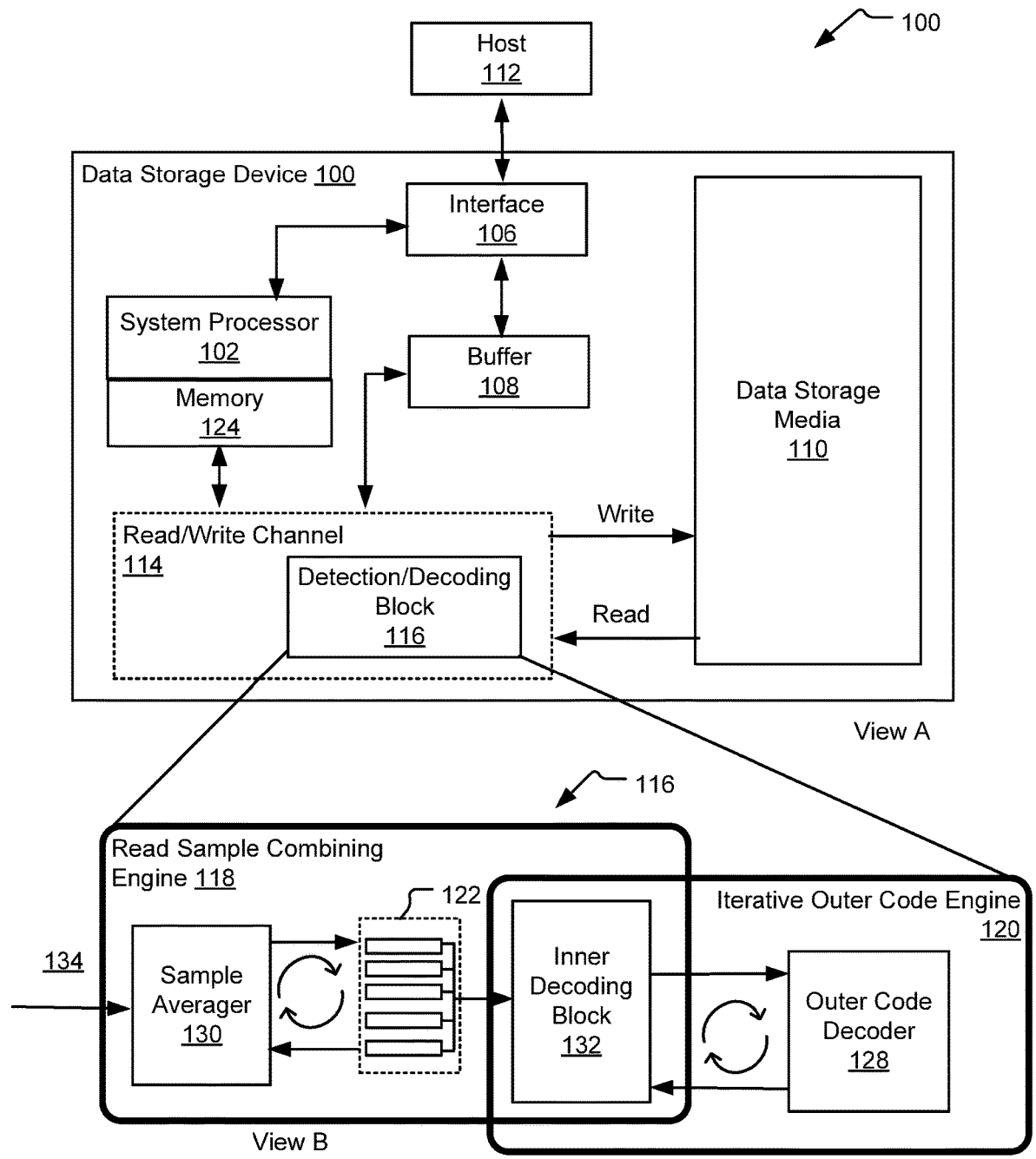
FIG. 1 illustrates an example storage device that implements co-dependent, concurrent recursive read averaging (RRA) and iterative outer code (IOC) recovery processes for powerful low-latency error recovery.

When data is requested by a host from a storage device such as a hard drive, the requested data may be checked after the request is fulfilled to ensure that the data written or read is free of errors. In some storage devices, this error check is implemented via a two-level parity encoding system in which data within a first set of groupings is encoded by an inner code and data within a second set of groupings is encoded by an outer code. For example, an sector-level inner code may embed parity bits within a sector usable to perform data correction within that sector while a track-level outer code may embed outer code parity bits within a track that are usable to correct the encoded bits of the inner code.

There exist a number of different algorithms that utilize inner code and/or outer code and that provide varying levels of protection. Among the various error recovery techniques employed, recursive read averaging (RRA) is a powerful recovery algorithm that relies on inner code and iterative outer code (IOC) (also referred to herein as iterative inner-and-outer code) is a powerful recovery algorithm that relies on inner code and outer code working in combination. In RRA, samples from multiple reads are combined or averaged together in a particular manner, such as by using maximum-ratio combining, to increase the signal to noise ratio and yield better read samples to provide to a detector and inner code decoder. In IOC, an inner code detector and decoding engine iterates back and forth with an outer code decoder to perform error recovery. In this process, the outer code decoder utilizes outer code parity information (e.g., track-level parity information) to try to correct errors that occur in the inner code information (e.g., sector-level encoded information) such that the inner code decoder can better correct such errors.

described herein disclosed error recovery process may be As there also exist a number of other read sample combining processes, the disclosed Many storage devices utilize RRA and IOC individually and/or sequentially. If, for example, an RRA process is unable to recover a set number of sectors, the averaged (improved) data samples generated by the RRA process may be provided as an input to the IOC process. However, this completely sequential use of these two algorithms may lead to higher command completion times than those associated with the herein disclosed decoding solutions.

The presently-disclosed technology includes a comprehensive error recovery process that provides for concurrent execution of certain RRA and IOC operations as well as for bidirectional feedback between separate RRA and IOC processes to allow the inner code detector and decoder to gain and benefit from side information (e.g., improved samples, corrected parity bits) generated by each of two processes occurring concurrently. This process dramatically increases the effectiveness of decoding and reduces latencies as compared to current approaches that invoke RRA and IOC separately.

Although most of the examples described herein pertain to recovery on magnetic media, it should be understood that the herein disclosed data recovery processes are equally applicable to SSD-based media.

It should be understood that RRA is one example of a "read sample combining recovery process," which is used herein to refer to a recovery process that combines samples of like-data to improve data quality. Although RRA is the primary example of a read sample combining recovery process disclosed herein, it should be understood that the disclosed co-dependent, concurrent recovery process may include any read sample combining recovery process and any IOC recovery process.

As used herein, two recovery processes are to be considered "concurrently executing" if they are either (1) performing respective operations at the same time or (2) if there exists overlap during the time between the beginning and end of each process. If, for example, an RRA recovery process and an IOC recovery process each entail multiple rounds of iterative decoding attempts, the processes are to be considered concurrent if the respective rounds of each process are interleaved with one another. For example, the following exemplary operations refer to an instance of concurrent execution: (1) N number of failed data blocks are identified; (2) an RRA process commences a first round in which operations are performed on a first subset of the N failed data blocks; (3) the RRA recovery process is paused while the IOC recovery process commences a first round in which operations are performed on a second subset of the N failed data blocks; (4) the IOC recovery process is paused while the RRA recovery process commences a second round in which operations are performed on a third subset of the N failed data blocks; (5) the RRA recovery process is paused while the IOC recovery process commences a second round in which operations are performed on a fourth subset of the N failed data blocks, and so on.

FIG. 1 illustrates an example storage device 100 that implements co-dependent, concurrent read sample combining and IOC recovery processes for powerful low-latency error recovery. The data storage device 100 includes a system processor 102 for executing read and write commands received from a host device 112 across an interface 106. In one implementation, the system processor 102 is a microprocessor such as a system-on-chip (SOC) or application-specific integrated circuit (ASIC). The system process or 102 executes software elements stored in memory 124, which may include volatile memory (e.g., RAM, DRAM, SRAM) and/or non-Holzer volatile memory (e.g., Flash). The system processor 102 is coupled to a buffer 108 through a read/write channel 114. The buffer 108 can temporarily store user data during read and write operations and may, in some implementations, be capable of storing read and write commands from the host 112 that are pending execution by the system processor 102.

The system processor 102 executes read and write operations from the host 112 on a data storage media, which may include one or more tangible-computer readable storage media. As used herein, tangible computer-readable storage media refers to a device of manufacture and is explicitly defined to exclude freely-propagating communication signals, such as a carrier wave or other signal transport mechanism. In a majority of the implementations described herein, the data storage media 110 includes one or more magnetic disks; however, the data storage media 110 may, in various implementations, include other types of storage including without limitation solid state storage (SSDs such as flash memory), CDROM, digital versatile disks (DVD) or other optical disk storage, magnetic cassettes, magnetic tape, RAM, ROM, EEPROM, etc.

When executing read and write operations from the host 112, the system processor 102 generates and transmits control signals through the read/write channel 114, which includes a detection/decoding block 116. The detection/decoding block 116 may be understood as including a collection of hardware and software elements that are controlled and executed by the system processor 102. During a write operation, data written to the data storage media 110 may be read back and verified by detection and decoding elements in the detection/decoding block 116 using an error correction code to ensure that the data is written to disk correctly. Likewise, during a read operation, data read back from the data storage media 110 is verified by detection and decoding elements in the detection/decoding block 116.

By example and without limitation, View B of FIG. 1 illustrates a few exemplary elements that may be included within the detection/decoding block 116. Specifically, the detection/decoding block 116 is shown to include a read sample combining engine 118 and an iterative outer code engine (iterative IOC engine 120). The read sample combining engine 118 and the iterative IOC engine 120 may be understood as being different circuit blocks that execute separate error-recovery processes. In one implementation, the recovery processes implemented by the read sample combining engine 118 and the iterative IOC engine 120 are each executed by the system processor 102 utilizing dedicated blocks of the memory 124 for storing executable decoding algorithms as well as the data read from the data storage media 110 being subjected to such processes.

In the illustrated implementation, the read sample combining engine 118 and iterative IOC engine 120 are shown sharing an inner decoding block 132. This Venn-diagram-like illustration intended to convey that the inner decoding block 132 performs processing based on inputs received from the read sample combining engine 118 and also from the iterative IOC engine 120.

In some implementations such as that described with respect to FIG. 2 below, the detection/decoding block 116 facilitates the parallel execution of decoding processes performed by both the read sample combining engine 118 and the iterative outer code decoder 120. For example, each of the read sample combining engine 118 and the iterative IOC engine 220 may concurrently perform operations to recover different data blocks by exercising selective control over the processing activities of and/or the resources allocated to the inner decoding block 132.

In other implementations such as that described with respect to FIG. 3 below, the detection/decoding block 116 does not facilitate parallel execution of two separate decoding processes but instead facilitates execution of a single, enhanced decoding process in which the iterative IOC decoder 120 maintains exclusive control over the inner decoding block 132 and performs iterative decoding processes based on the inputs generated from the read sample combining engine 118.

In both of the above-mentioned implementations, the read sample combining engine 118 and iterative IOC engine 120 perform processing operations—some of which may occur concurrently—to recover data read form the storage media 110. In addition to executing some concurrent operations, the various operations performed by the read sample combining engine and the iterative IOC engine 120 are co-dependent in the sense that decoding attempts performed by detection/decoding block 116 jointly depend on inputs generated by both of the two engines (e.g., there exist bidirectional feedback channels between the two engines).

Data read from the data storage media 110 is provided to a sample average 130 of the read sample combining engine 118 through an input channel 134. The sample averager 130 of the read sample combining engine 118 may be understood as circuitry that performs operations to combine and/or average together corresponding read samples collected at different times. In one implementation, the read sample combining engine 118 performs a recursive read averaging (RRA) recovery process. For example, the sample averager 130 may receive and initially store data of a failed sector "N" in one of the buffers 122. When a second pass of a read element is made over sector N, this data is read again and may at that time be averaged with the earlier-read data of sector N and re-saved in another one of the buffers 122.

Each time that a data sample read from a data block is updated via averaging with another corresponding sample read from the same data block, the updated data is subject to processing by the inner decoding block 132. The inner decoding block 132 uses redundant parity information included within the encoded bits to recover the data bits in the bit-stream. If the inner decoding block 132 can successfully decode (recover) the data of a given block, the associated data sample stored within the buffers 122 can be released and the recovered data is sent to a location in the memory 124 (e.g., DRAM) that is accessible by the host 112.

If the inner decoding block 132 is unable to successfully decode the data of a given block, the data block is regarded as a failed block and retained in the buffers 122 for a subsequent recovery attempt. As used herein, a "failed block" refers to a unit of data, such as a data sector, that includes a number of read errors exceeding a maximum number recoverable by an initially-utilized ECC. At the same time that the read sample combining engine 118 is receiving and averaging data samples as described above, the iterative IOC engine 120 may also be co-executing a recovery process that relies on an outer code. This process is described in greater detail below.

In general, the inner decoding block 132 performs decoding operations on blocks of a first size while the outer code decoder 128 performs decoding operations on data blocks of a second larger size (e.g., each data block of the second larger size may include multiple blocks of the first size). For example, in a disk-based system, the inner decoding block 132 may perform decoding on individual data sectors while the outer code decoder 128 performs decoding on individual tracks that include multiple sectors. Alternatively, in an SSD-type system, the inner decoding block 132 may perform decoding on individual pages of Flash storage while the outer code decoder 128 performs decoding on a larger unit of pages, sometimes referred to as a "super block," which may, for example include one or more blocks or dies. For example, the super block may be a garbage collection unit (GCU).

The outer code utilizes outer code encoded bits to detect and correct errors in the bits of the inner code. For example, the outer code decoder 128 may analyze inner code bits within different sectors of a same track and try to correct these sector-level errors using additional outer code parity embedded at the track level (e.g., stored in a separate parity sector of the track). As the outer code decoder 128 identifies and corrects errors in the inner codewords, updated reliability information is passed back to the inner decoding block 132 and subjected to another decoding attempt by the inner decoding block.

While the outer code decoder 128 is iterating back and forth with the inner decoding block 132, data samples in the buffers 122 are continuously being updated by the iterative rounds of the read sample combining engine 118. This concurrent updating of samples by the sample average and decoding by the outer code decoder 128 beneficially allows the inner decoding block 132 to perform each of multiple rounds of iterative decoding based on improved inputs from both processes—e.g., each round utilizes (1) updated and corrected side information (e.g., reliability information) provided by the OC decoder 128 in the previous iteration and (2) an updated version of the data sample due to on-going and concurrent sample updating performed by the sample averager 130.

Further exemplary elements of and operations performed by the read sample combining engine 118 are described in detail within U.S. Pat. No. 9,928,854 "Miso Equalization with ADC Averaging," issued on Mar. 27, 2018, which is hereby incorporated by reference. Likewise, further exemplary elements of and operations performed by the IOC engine 120 are described in detail with respect to U.S. Pat. No. 9,015,549 "Iterative Inner and Outer Codes for Data Recovery," issued Apr. 21, 2015 and also within U.S. Pat. No. 9,396,062, "Group Codes for Multi-Dimensional Recording," issued on Jul. 19, 2016, both of which are hereby incorporated by reference.

Figure 2:
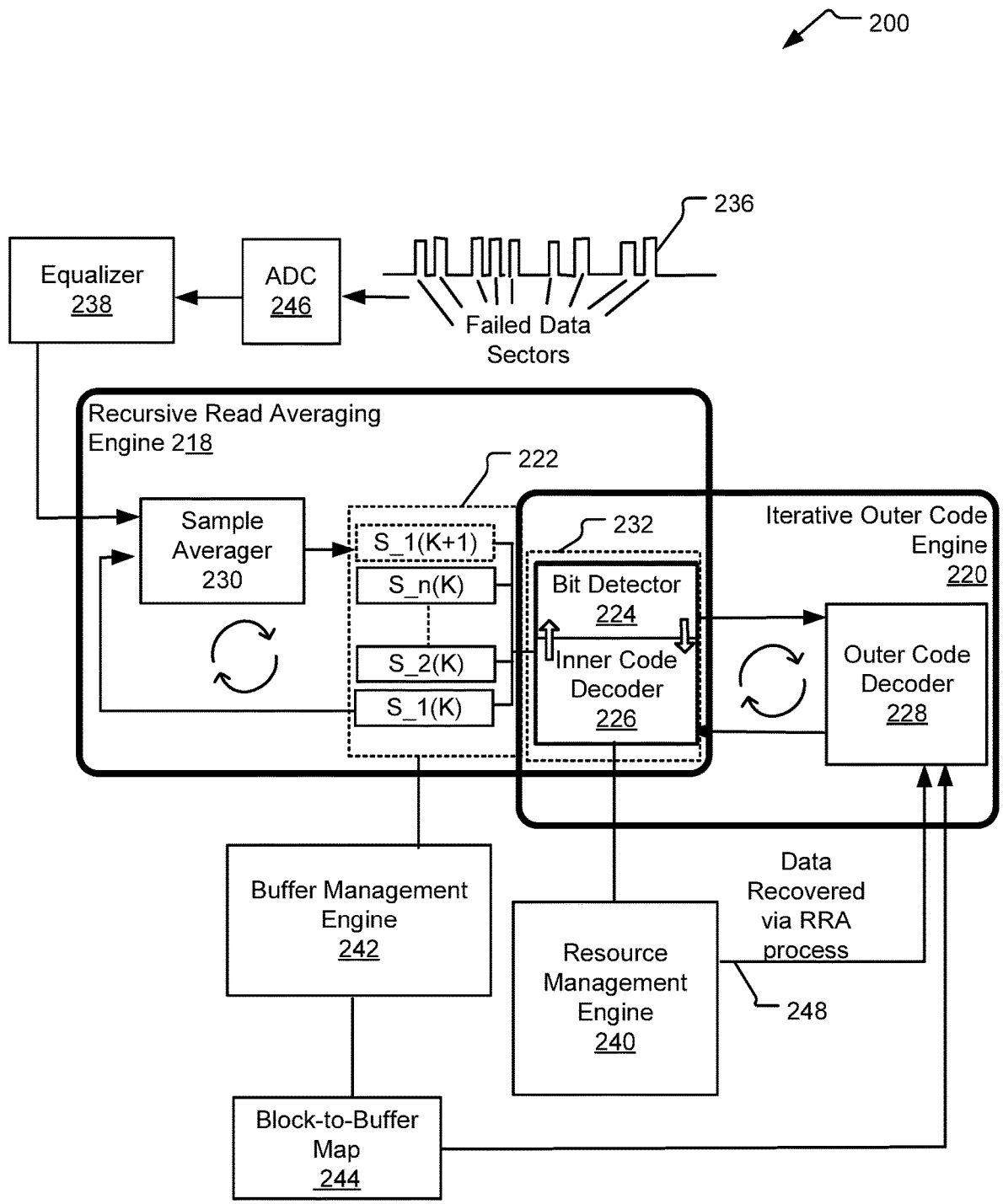
FIG. 2 illustrates aspects of another example decoding system that implements concurrent and co-dependent recursive read averaging and iterative outer code decoding processes.

FIG. 2 illustrates aspects of another decoding system 200 that implements concurrent and co-dependent recursive read averaging and iterative outer code decoding processes. The decoding system 200 includes an RRA engine 218 and an iterative IOC engine 220 capable of performing concurrent and separate iterative error recovery process that are co-dependent in the sense that each of the two engines may continuously receive and process inputs generated by the other one of the two engines.

In the illustrated implementation, the RRA engine 218 and iterative IOC engine 220 share (jointly utilize data stored in) a set of sample buffers 222 within a read/write channel. Additionally, each process entails operations performed by a same inner decoding block 232 that includes a bit detector 224 and an inner code decoder 226. The iterative IOC engine 220 additional includes an outer code decoder 228, while the RRA engine 218 additionally includes a sample averager 230.

As data is read from a storage media, data of failed data sectors 236 is provided to an analog-to-digital converter (ADC 246) in the form of a continuous time signal. The ADC 246 generates ADC samples that are provided to an equalizer 238, which generates equalized samples. The equalized samples are provided the sample averager 230 of the RRA engine 218 which may, in different implementations, perform a variety of different types of averaging and combining operations including, for example, X-averaging recover, SERV-averaging recovery, and/or ATIC recovery.

As each data block is initially received and/or operated upon by the sample averager 230, the block is placed into one of the sample buffers 222 and processed by the inner decoding block 232. By example and without limitation, the sample buffers 222 may save up to "n" sectors concurrently, and each of the buffers 222 is shown storing the associated sample at the "kth" read. For example, $S\_1(k)$ may represent the first read of sector 1 while $S\_2(k)$ represents the first read of sector 2 and so on up to the first read of sector "n." During the next read (k+1) of the dataset, the samples from the new read are averaged/combined with the previous set of samples for each sector. For example, when the storage device re-reads sector $S\_1$, the sample averager 230 averages the original sample of the sector (S_1($k$)) with the newly-read and equalized sample, outputting an updated (averaged) sample S_1($k$+1). At this time, the previously-stored sample for this sector is discarded from the read/write channel and the inner decoding block 232 again attempts to recover the data of the sample.

If the inner decoding block 232 is unable to recover the data of the sample (e.g., a sector or other data block), a system level controller (not shown) requests a re-read of the sample. The re-read sample is equalized by the equalizer 238 and the sample averager 230 combines together the new sample and the original sample. The updated sample is stored in another one of the buffers 222 and the buffer storing the original sample is freed up.

In different implementations, the bit detector 224 and inner code decoder 226 may assume different forms and perform different operations. In one implementation where the decoding system 200 decodes data read from a magnetic disk, the bit detector 224 is a Viterbi detector that implements a 2-D soft output Viterbi Algorithm (SOVA). The inner code decoder 226 implements a decoding scheme such as a low-density parity check (LDPC) or the Reed-Solomon (RS) code.

Upon receipt of each updated or newly-received sample, the bit detector 224 analyzes the bits in the block and determines a likelihood that each bit is a 1 or a 0. In one implementation, the bit detector 224 provides this information in the form of log-likelihood ratios (LLRs) to the inner code detector 226. The inner code detector 226 attempts to decode (correct errors in the failed block) using the LLRs to interpret the bit stream and parity bits of the inner code that are included within the bit stream.

If the inner decoding block 232 is able to decode and correct the failed block, the corrected data is sent to DRAM (not shown) accessible by a system controller, while the associated block data is released from the sample buffers 222 and the read/write channel. If the inner decoding block 232 unable to recover the failed block, the system controller may requests a re-read of the block and the inner code decoding block 232 may repeat the recovery attempt again once the stored sample has been updated by the sample average 230 based on the re-read.

While the RRA engine 218 is performing the above-described operations, the IOC engine 220 may selectively elect to attempt decoding of one or more of the failed data blocks. The iterative IOC engine 220 employs an outer code decoder 228 (e.g., a Reed Solomon decoder) to attempt to recover inner code parity bits. For example, the outer code decoder 228 may use a code word stored in a designated parity sector for a data track to solve for and correct inner code encoded bits within the data-storing sectors of the data track.

While performing active recovery operations, the outer code decoder 228 may maintain a most-current version of the sample data in a designated memory space external the read/write channel (e.g., outside of the buffers 222), such as in volatile or non-volatile memory of the storage device. When the inner decoding block 232 successfully recovers a given data block of the inner code block size (e.g., a sector), the contribution of that data block's recovered information is updated in the memory space of the outer code and released from the buffers 222. Consequently, the outer code may subsequently access the recovered data block's information as needed to perform error recovery on a related block of the outer code block size (e.g., a data track that includes the recovered sector).

In the implementation of FIG. 2, the RRA engine 218 and the iterative IOC engine 220 are each configured to independent assume control of the inner decoding block 232 so as to facilitate concurrent and separate decoding attempts by the RRA engine 218 and the iterative IOC engine 220. For example, the RRA engine 218 may attempt to decode a first sector using the RRA recovery process at the same time that the iterative IOC engine 220 is attempting to decode a second different sector. The decoding attempts of each of the two engines may be performed concurrently in the sense that each block may be actively executing a loop of operations to decode a different target data block at the same time. Here, access to the inner decoding block 232 may be selectively toggled back and forth between the two engines such that the inner decoding block 232 sequentially-executes requests received from the RRA engine 218 and the iterative IOC engine 220.

To implement the foregoing, a resource management engine 240 executes logic to handle collisions that may occur when the RRA engine 218 and the IOC engine 220 attempt to access the inner decoding block 232 at the same time. If, for example, the RRA engine 218 instructs the inner decoding block 232 to attempt a decoding of sector A at the same time that the IOC engine 220 instructs an iterative IOC decoding attempt of sector B, the resource management engine 240 implements logic to ensure the two requests are sequentially executed according to a predefined priority scheme. Likewise, the resource management engine 240 may independently track the sampled information recovered via the RRA process and provide this information to the iterative outer code engine 220 (e.g., as shown by arrow 248). For example, the resource management engine 240 selectively update the memory space utilized by the outer code decoder 228 such that this memory space contains the data recovered by the RRA process.

In the above-described process, the rate of availability of new and updated samples within the buffers 222 may be asynchronous to the rate of iterations of the IOC engine 220 such that it is possible for a sample to be updated while the IOC engine 220 is attempting to decode the earlier version of the sample. In one implementation, this updated sample information is, at each iteration of the inner decoding block 232, merged with the most recently-derived side information (e.g., updated/corrected inner code parity bits) from the outer code decoder 228. Consequently, each round of RRA decoding operations may be performed based on inputs (e.g., updated reliability information) derived by the iterative IOC engine 220 and each round of iterative IOC decoding operations may be performed based on inputs (e.g., updated samples) derived by the RRA engine 218.

To effectively grant the iterative IOC engine 220 to the newly-prepared (updated) data samples in the buffer 222 at each iteration of the iterative IOC process, the decoding system 200 further includes a buffer management engine 242 that shares buffer mapping information with the iterative IOC engine 220. Specifically, the buffer management engine 242 maintains a block-to-buffer map 244 that associates each buffer within the set of buffers 222 with a corresponding block ID identifying the physical data block on the primary device storage media that stores the data currently residing in the buffer. For example, the block ID may be a sector ID. Due to the block-to-buffer map 244, the iterative IOC engine 220 has knowledge of where the updated sample data for each data block is stored even as the RRA engine 218 effectively moves those samples around between the different buffers 222.

The iterative IOC engine 220 initiates and controls IOC recovery operations on select target data blocks in which the inner decoding block 232 and the outer code decoder 228 iterate decoding output (e.g., including data bits and parity information) back and forth until the segments converge or until a threshold number of iterations have been performed without convergence. During this process, the iterative IOC engine 220 periodically references the block-to-buffer map 244 to identify which of buffers 222 stores the most recent sample data for the target data block. The updated sample data is then copied to the memory space used by the outer code decoder 228. In this sense, the iterative IOC engine 220 may perform multiple rounds of an IOC process recovery attempt on a single target data block in which each of the rounds begins by updating the target block sample in the outer code memory space to reflect the most recent sample update performed by the RRA engine 218.

Figure 3:
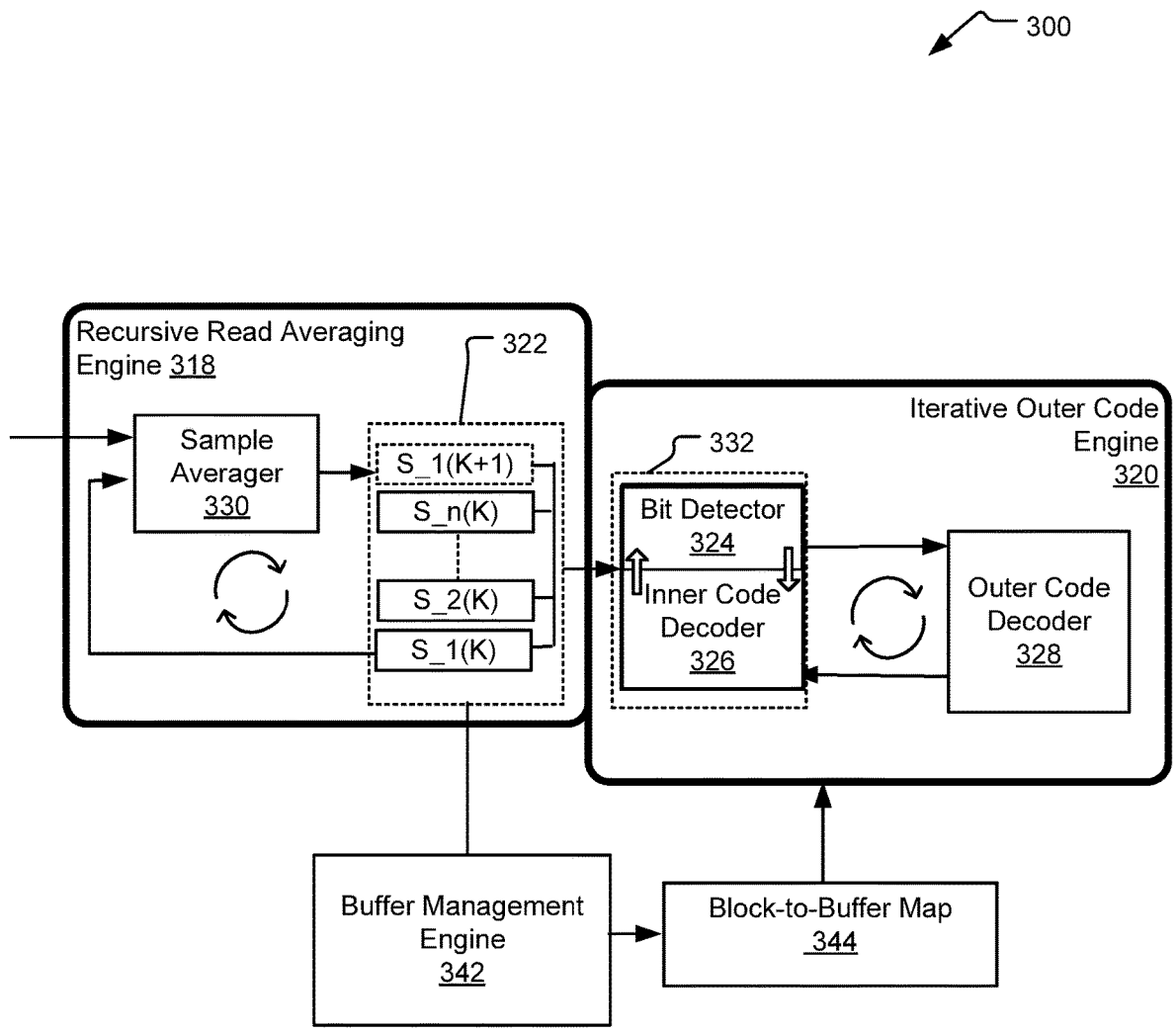
FIG. 3 illustrates aspects of another example decoding system that executes concurrent and co-dependent recursive read averaging and iterative outer code decoding processes.

FIG. 3 illustrates another decoding system 300 that executes concurrent and co-dependent recursive read averaging and iterative outer code decoding processes. The elements shown with respect to decoding system 300 are assumed to be the same or similar in form and function to those corresponding like-named elements described above with respect to FIG. 2. Similar to the decoding system of FIG. 2, FIG. 3 includes an RRA engine 318 that receives equalized samples and performs averaging operations to continuously re-sample and update failed data blocks stored in a set of buffers 322. Unlike FIG. 2, however, an iterative IOC engine 330 assumes complete control over the resources of an inner decoding block 332. That is, the RRA engine 318 does not send requests to or receive updated data back from an inner decoding block 332.

In this implementation, the iterative IOC engine 320 manages all activity of the inner decoding block 332 while the RRA engine 318 continuously performs sample averaging and updates the samples residing in the sample buffers 322. In this case, there is no potential for collisions between processing requests of the RRA engine 318 and the iterative IOC engine 320 and the decoding system 300 therefore does not include a hardware mechanism for managing collisions or for forwarding recovered data from the RRA engine 318 to the iterative IOC engine 320.

The iterative IOC engine 320 manages a single recovery process (e.g., decoding one data block at a time) which may be understood as including both the decoding operations of the RRA-based decoding process in addition to the decoding operations of an iterative IOC decoding process. As with the system of FIG. 2, the decoding system 300 includes a buffer management engine 342 that maintains and a block-to-buffer map 344 correlating buffer IDs with physical data block identifiers. Consequently, the iterative IOC engine 320 updates the outer code memory space with new RRA sample data throughout the iterative recovery operations of each target data block. In this sense, individual iterative decoding operations of the decoding system 300 depend upon the RRA samples that update at each iteration as well as upon the outer code inputs that are generated based on the continuously updating samples.

Notably, the recovery schemes described about with respect to both of FIGS. 2 and 3 facilitate a decrease in average command completion time (CCT) as compared to existing processes that implement separate and/or sequential RRA and IOC processes. Two levels of efficiency can be observed with the proposed schemes including (1) efficiencies arising from the use of parallel RRA and IOC architecture instead of a sequential architecture (thus reducing total computation times); and (2) better quality information within the IOC decoding process due to the fact that the inner decoding block continuously (e.g., LDPC/SOVA engine) benefits from the improved samples generated throughout the RRA process, which results in better information for the OC decoder and consequently, quicker resolution.

Still another additional benefit to the proposed recovery schemes arises from ease of use. In previous solutions, decoding logic is typically encoded to decide how long to run RRA before invoking IOC since there exists a non-zero probability that the IOC recovery scheme may fail if the initial samples provided to the IOC decoding engine are not good enough. In the presently-disclosed systems, however, no such decisions have to be made because the samples used in the IOC decoding operations continue to improve due to ongoing RRA along with each successive iteration of the IOC process.

One consequence of the aforementioned improved recovery time for individual data blocks is that the sample buffers (222, 322) can be used more efficiently so as to allow for error correction of a larger total number of data blocks in a given time interval than currently-existing solutions that implement sequential (rather than concurrent) RRA and IOC processes. In these previous/existing solutions, failed sectors that cannot be resolved by the RRA process are held in the sample buffers throughout the duration of the RRA process and into the commencement of the IOC process. In contrast, the concurrent RRA and IOC operations in the presently-disclosed processes allows for quicker block-level resolution which, in turn, allows the individual sample buffers to be freed-up more quickly and re-populated with other failed blocks, further speeding up the entire error decoding process.

Figure 4:
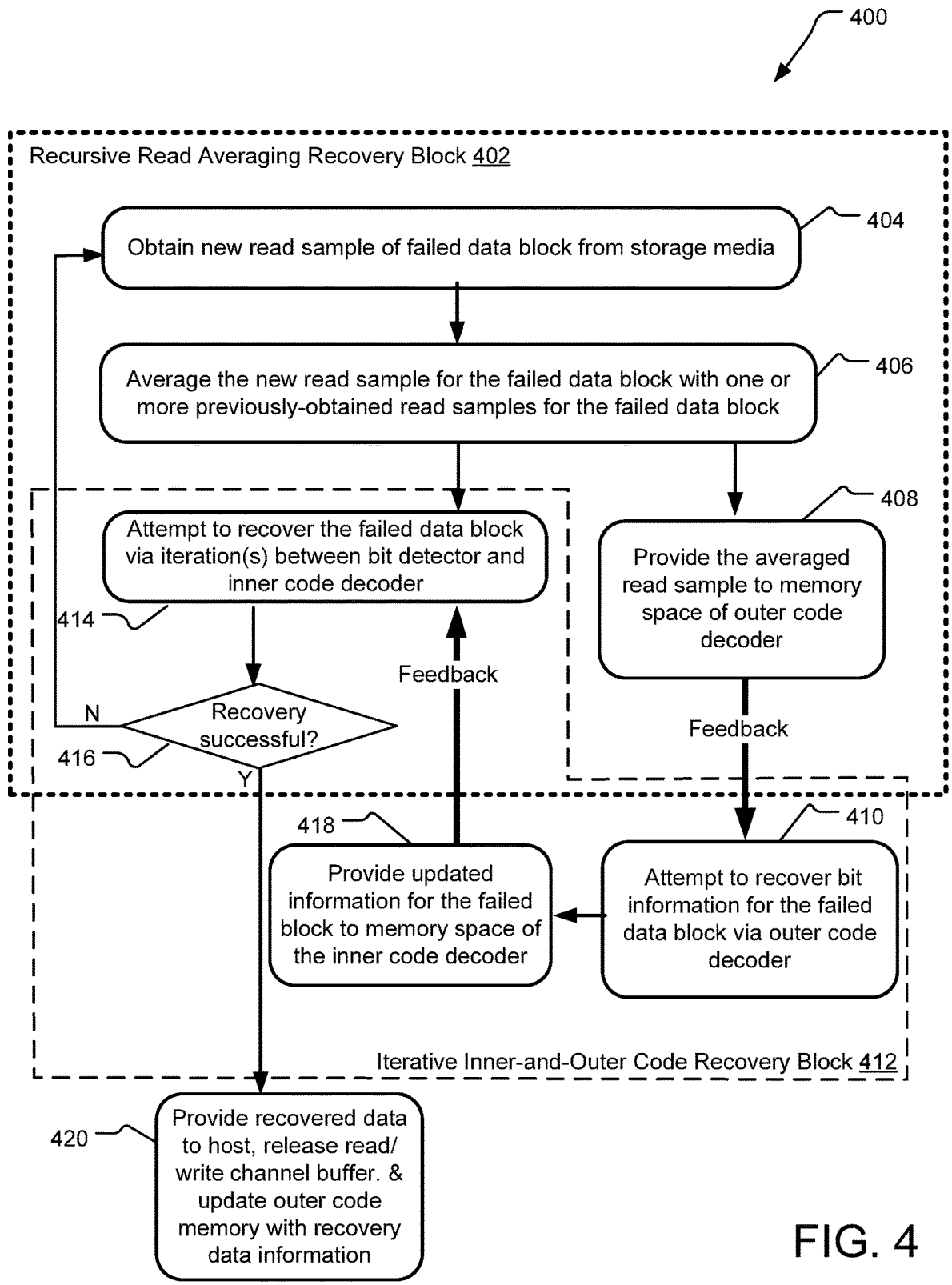
FIG. 4 illustrates example operations for data recovery using concurrently-executing recursive read averaging and iterative outer code recovery processes.

FIG. 4 illustrates example operations 400 for data recovery using concurrently-executing recursive read averaging and iterative outer code recovery processes. The example operations 400 are each performed within one of two iterative logic blocks that provide bidirectional feedback to one another while concurrently executing. A recursive read averaging (RRA) recovery block 402 performs operations of an RRA recovery process while an iterative inner-and-outer code (IOC) recovery block 412 performs operations of an IOC recovery process.

Although there may exist implementations where each of the RRA recovery block 402 and IOC recovery block 412 perform error recovery on different blocks simultaneously, the operations 400 illustrate a particular scenario where each of the RRA recovery block 402 and IOC recovery block 412 are concurrently performing error recovery operations on a same data block. Notably, there exist feedback mechanisms (e.g., operations 408, 410, 418) between the RRA recovery block 402 and IOC recovery block 412 that may be the same or similar even in scenarios when the two blocks are concurrently working on decoding different data blocks.

During the RRA recovery process, a sampling operation 404 obtains a new read sample from a failed data block. For example, the failed data block is stored in a read/write channel buffer and was not successfully recovered in a previous attempt. The new sample is read from a storage media and an averaging operation 406 averages the new read sample for the failed data block with one or more previously-obtained read samples for the failed data block. This new averaged sample may be saved in another read/write channel buffer.

A feedback operation 408 provides the updated (averaged) sample data to the IOC recovery block 412, such as via an update to a memory space allocated to an outer code decoder. At the same time that this sample is provisioned to the IOC recovery block 412, the RRA recovery block 402 may execute an inner code recovery attempt operation 414 on the failed data block. The inner code recovery attempt operation 414 may, for example, entail one or more iterations between a bit detector and an inner code decoder.

A determination operation 416 determines whether or not the inner code recovery attempt operation 414 was successful. If the data of the failed data block was successfully recovered, a providing operation 420 provides the recovered data to a host and releases the data (both samples and recovered data) from the read/write channel. The outer code memory is also updated with the recovered data. If the determination operation 416 determines that the inner code recovery attempt operation 414 did not succeed, the sampling operation 404 is repeated and the operations 406, 408, and 414 repeat until the inner code recovery attempt operation 414 succeeds.

Concurrent with the above-described iterative operations of the RRA recovery block 402, the iterative IOC recovery block 412 performs a separate iterative recovery process on the failed data block that is based on the feedback (e.g., the updated averaged sample) received during the most recent iteration of the feedback operation 408.

The recovery process of the IOC recovery block 412 executes an outer code recovery attempt operation 410 by processing the bit stream of the failed data block with an outer code decoder. In addition to processing the bit stream of the failed data block, the outer code decoder also processes data read from a larger data unit until including the failed data block. If, for example, the failed data block is a failed sector, the outer code decoder may process data read from many sectors of a data track that includes the failed sector. This data may be stored in a memory space dedicated to the outer code decoder that is periodically updated via the feedback operation 408.

The outer code recovery attempt operation 410 uses parity bits of the outer code to try to correct bit-errors within a failed data block. The outer code decoder outputs updated bit information for the failed block and a second feedback operation 418 provides this updated information for the failed block to the inner code decoder, such as by updating a memory space utilized by the inner code decoder.

The inner code recovery attempt operation 414 and operations of the RRA recovery block may repeat, as described above, until the inner code recovery attempt operations 414 is successful. In this way, each iteration of the outer code recovery attempt operation 410 is based on newly-updated sample data of the RRA recovery process and each iteration of the inner code recovery attempt operation 414 is based on updated parity information generated by the outer code decoder.

The embodiments of the disclosed technology described herein are implemented as logical steps in one or more computer systems. The logical operations of the presently disclosed technology are implemented (1) as a sequence of processor-implemented steps executing in one or more computer systems and (2) as interconnected machine or circuit modules within one or more computer systems. The implementation is a matter of choice, dependent on the performance requirements of the computer system implementing the disclosed technology. Accordingly, the logical operations making up the embodiments of the disclosed technology described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the disclosed technology. Since many embodiments of the disclosed technology can be made without departing from the spirit and scope of the disclosed technology, the disclosed technology resides in the claims hereinafter appended. Furthermore, structural features of the different embodiments may be combined in yet another embodiment without departing from the recited claims.

What is claimed is:

1. A system comprising:
a first circuit block that performs a read sample combining recovery process on a data block responsive to a failed initial attempt to read the data block, each of multiple rounds of the read sample combining recovery process combining together different data samples read from the data block; and
a second circuit block that performs an iterative outer code (IOC) recovery process concurrent with the read sample combining recovery process.

2. The system of claim 1, wherein each round of the IOC recovery process is based on newly-updated data samples generated by the first circuit block during the read sample combining process.

3. The system of claim 2, wherein the first circuit block performs decoding operations based on inputs generated by the second circuit block during the IOC recovery process.

4. The system of claim 1, wherein actions performed by the first circuit block during each of the multiple rounds of the read sample combining recovery process include:
updating a read sample stored in one of a plurality of sample buffers, the updated read sample being an average of multiple read samples associated with a failed data segment;
providing the updated read sample to an inner code decoder; and
executing, at the inner code decoder, a recovery attempt of the failed data segment based on the updated read sample.

5. The system of claim 4, wherein the system
includes a buffer management engine configured to:
manage a buffer-to-block map correlating a data block ID for each failed data block of a plurality of failed data blocks to a corresponding one of the plurality of sample buffers storing data read from the failed data block.

6. The system of claim 5, wherein the read sample combining recovery process is a recursive read averaging recovery process.

7. The system of claim 1, wherein actions performed by the second circuit block during each of the multiple rounds of the IOC recovery process include:
providing, as inputs to an outer code decoder, decoded information extracted from one or more averaged read samples generated by the first circuit block during a previous round of the read sample combining recovery process;
executing logic of the outer code decoder to update the decoded information;
providing the updated decoded information as reliability information to an inner code decoder; and
executing, at the inner code decoder, a recovery attempt of one or more failed data segments based on the updated reliability information.

8. The system of claim 7, wherein the updated decoded information generated during the IOC recovery process is used in a next recovery attempt of the read sample combining recovery process.

9. The system of claim 7, wherein the inner code decoder receives an updated read sample generated by the first circuit block during each round of the read sample combining recovery process and also receives updated reliability information generated by the second circuit block during each round of the IOC recovery process.

10. A method comprising:
performing multiple rounds of a read sample combining recovery process on a data block responsive to a failed initial attempt to read the data block, each of multiple rounds of the read sample combining recovery process combining together different data samples read from the data block; and
performing an iterative outer code (IOC) recovery process concurrent with the read sample combining recovery process, each round of the IOC recovery process being based on newly-updated data samples generated during the read sample combining recovery process.

11. The method of claim 10, wherein performing multiple rounds of the read sample combining recovery process includes executing decoding operations based on inputs generated by the IOC recovery process.

12. The method of claim 10, wherein performing multiple rounds of the read sample combining recovery process further comprises:
updating a read sample stored in one of a plurality of sample buffers, the updated read sample being an average of multiple read samples associated with a failed data segment;
providing the updated read sample to an inner code decoder; and
executing, at the inner code decoder, a recovery attempt of the failed data segment based on the updated read sample.

13. The method of claim 12, wherein performing multiple rounds of the IOC recovery process further comprises:
providing, as inputs to an outer code decoder, decoded information extracted from one or more averaged read samples generated during a previous round of the read sample combining recovery process;
executing logic of the outer code decoder to update the decoded information;
providing the updated reliability information to an inner code decoder; and
executing, at the inner code decoder, a recovery attempt of one or more failed data segments based on the updated reliability information.

14. The method of claim 13, wherein the updated decoded information generated during the IOC recovery process is used by the inner code decoder in a next recovery attempt of the read sample combining recovery process.

15. The method of claim 13, wherein the inner code decoder receives the updated read sample generated during each round of the read sample combining recovery process and also receives the updated decoded information generated during each round of the IOC recovery process.

16. The method of claim 12, further comprising:
managing a buffer-to-block map, the buffer-to-block map correlating a data block ID for each failed data block a plurality of failed data blocks to a corresponding buffer of the plurality of sample buffers that stores data read from the failed data block.

17. The method of claim 16, further comprising:
updating the buffer-to-block map each time the read sample combining recovery process alters a buffer location for data of one of a failed data block.

18. One or more tangible computer-readable storage media encoding computer-executable instructions for executing a computer process, the computer process comprising:
performing multiple rounds of a read sample combining recovery process on a data block responsive to a failed initial attempt to read the data block, each of multiple rounds of the read sample combining recovery process combining together different data samples read from the data block; and
performing an iterative outer code (IOC) recovery process concurrent with the read sample combining recovery process, each round of the IOC recovery process being based on newly-updated data samples generated during the read sample combining recovery process.

19. The one or more tangible computer-readable storage media of claim 18, wherein performing multiple rounds of the read sample combining recovery process includes executing decoding operations based on inputs generated by the IOC recovery process.

20. The one or more tangible computer-readable storage media of claim 18, wherein performing multiple rounds of the read sample combining recovery process further comprises:
updating a read sample stored in one of a plurality of sample buffers, the updated read sample being an average of multiple read samples associated with a failed data segment;
providing the updated read sample to an inner code decoder; and
executing, at the inner code decoder, a recovery attempt of the failed data segment based on the updated read sample.

* * * * *